US 6,657,919 B2

(12) United States Patent
Foss et al.

(10) Patent No.: US 6,657,919 B2
(45) Date of Patent: Dec. 2, 2003

(54) DELAYED LOCKED LOOP IMPLEMENTATION IN A SYNCHRONOUS DYNAMIC RANDOM ACCESS MEMORY

(75) Inventors: Richard C. Foss, Calabogie Lake (CA); Peter B. Gillingham, Kanata (CA); Graham Allan, Stittsville (CA)

(73) Assignee: MOSAID Technologies Incorporated, Kanata (CA)

( * ) Notice: Subject to any disclaimer, the term of this patent is extended or adjusted under 35 U.S.C. 154(b) by 0 days.

(21) Appl. No.: 10/348,062

(22) Filed: Jan. 17, 2003

(65) Prior Publication Data

US 2003/0107944 A1 Jun. 12, 2003

Related U.S. Application Data

(63) Continuation of application No. 10/279,217, filed on Oct. 23, 2002, which is a continuation of application No. 09/977,088, filed on Oct. 12, 2001, which is a continuation of application No. 09/761,274, filed on Jan. 16, 2001, now Pat. No. 6,314,052, which is a continuation of application No. 09/392,088, filed on Sep. 8, 1999, now Pat. No. 6,205,083, which is a continuation of application No. 08/996,095, filed on Dec. 22, 1997, now Pat. No. 6,067,272, which is a continuation of application No. 08/319,042, filed on Oct. 6, 1994, now Pat. No. 5,796,673.

(51) Int. Cl.[7] .................................................. G11C 8/00
(52) U.S. Cl. ...................................... 365/233; 365/194
(58) Field of Search ................................ 365/194, 233, 365/189.05

(56) References Cited

U.S. PATENT DOCUMENTS

| 4,754,164 A | 6/1988 | Flora et al. | |
| 5,223,755 A | 6/1993 | Richley | 307/603 |
| 5,287,319 A | 2/1994 | Fukumoto | |
| 5,311,483 A | 5/1994 | Takasugi | |
| 5,319,755 A | 6/1994 | Farmwald et al. | |
| 5,440,515 A | * 8/1995 | Chang et al. | 365/194 |
| 5,544,203 A | 8/1996 | Casasanta et al. | |
| 5,553,276 A | 9/1996 | Dean | 395/550 |
| 5,604,775 A | 2/1997 | Saitoh et al. | |
| 5,796,673 A | 8/1998 | Foss et al. | |
| 6,067,272 A | 5/2000 | Foss et al. | |
| 6,205,083 B1 | 3/2001 | Foss et al. | |

FOREIGN PATENT DOCUMENTS

| JP | 0214094 | 8/1990 | G11C/11/409 |

OTHER PUBLICATIONS

Nakamura, Kazuyuki, et al., "A 200–MHz Pipelined 16–Mb BiCMOS SRAM with PLL Proportional Self–Timing Generator," *IEEE Journal of Solid–State Circuits*, vol. 29, No. 11, pp. 1317–1322 (Nov. 1994).

Kushiyama, N., et al., "500 Mbyte/sec Data–Rate 512 Kbits x 9 DRAM Using a Novel I/O Interface," 1992 Symposium on VLSI Circuits Digest of Technical Papers, pp. 66–67 (1992).

Kushiyama, Natsuki, et al., "A 500–Megabyte/s Data–Rate 4.5M DRAM," *IEEE Journal of Solid–State Circuits*, vol. 28, No. 4, pp. 490–498 (Apr. 1993).

Nakamura, Kazuyuki, et al., "A 220MHz Pipelined 16Mb BiCMOS SRAM with PLL Proportional Self–Timing Generator," IEEE International Solid–State Circuits Conference, Session 15, pp. 258–259, 200–201 & 312 (Feb. 18, 1994).

* cited by examiner

*Primary Examiner*—Michael Tran
(74) *Attorney, Agent, or Firm*—Hamilton, Brook, Smith & Reynolds, P.C.

(57) ABSTRACT

A clock applying circuit for a synchronous memory is comprised of a clock input for receiving a clock input signal, apparatus connected to the synchronous memory for receiving a driving clock signal, and a tapped delay line for receiving the clock input signal and for delivering the clock driving signal to the synchronous memory in synchronism with but delayed from the clock input signal, the delay being a small fraction of the clock period of the clock input signal.

17 Claims, 3 Drawing Sheets

DELAYED LOCKED LOOP IMPLEMENTATION IN A SYNCHRONOUS DYNAMIC RANDOM ACCESS MEMORY

RELATED APPLICATIONS

This application is a Continuation of Application Ser. No. 10/279,217, filed Oct. 23, 2002, which is a Continuation of Application Ser. No. 09/977,088, filed Oct. 12, 2001, which is a Continuation of Application Ser. No. 09/761,274, filed Jan. 16, 2001, now U.S. Pat. No. 6,314,052, which is a Continuation of Application Ser. No. 09/392,088 filed Sep. 8, 1999, now U.S. Pat. No. 6,205,083 which is a Continuation of Application Ser. No. 08/996,095 filed Dec. 22, 1997, now U.S. Pat. No. 6,067,272, which is a Continuation of Application Ser. No. 08/319,042, filed Oct. 6, 1994, now U.S. Pat. No. 5,796,673. The entire teachings of the above applications are incorporated herein by reference.

FIELD OF THE INVENTION

This invention relates to the field of semiconductor memories, and in particular to a circuit for applying a clock to a synchronous memory such as a synchronous dynamic random access memory (SDRAM).

BACKGROUND TO THE INVENTION

An SDRAM, shown in block diagram in FIG. 1 typically operates as follows, with reference to the signal timing diagram shown in FIG. 2. A clock input terminal 1 receives a clock input signal CLK. The remainder of the SDRAM is represented by the memory array and support circuitry block 3. The clock signal arriving at the clock input terminal 1 is buffered inside the SDRAM, represented by the receiver 5 and buffer 6, and is distributed to internal circuitry of the SDRAM.

A signal at the output of the memory array and support circuitry 3 is applied to output buffers, represented by output buffer 8, which is enabled by the clock signal to drive data onto data terminals 10 of the SDRAM. However, due to the delays caused by the internal buffering and the interconnect wire on the integrated circuit chip that distributes the clock signal, the clock signal arrives at the enable terminal of the buffers delayed from the clock input signal. This delayed clock signal is illustrated in FIG. 2 as signal ICLK.

Assuming that the system is responsive to the rising edge of the clock signal, the delay between the rising edges is shown in FIG. 2 as internal clock skew 12. This clock skew can be a significant fraction of the clock period if the part is driven with a high frequency clock. The clock skew typically determines the maximum speed of the part. As the operating frequency of the part increases, as determined by the clock frequency, the clock skew delay causes enabling of the output buffer 8 too late relative to the next rising clock edge and the valid data at the output data terminals 10 will appear too late for the receiving chip.

Prior to the present invention, there were either of two solutions used to deal with this problem: (a) making the clock buffer circuitry between the clock input terminal 1 and the output buffer circuit enable terminal as fast as possible, and (b) using a phase locked loop (PLL) to drive the enable terminal of the output buffer.

Implementing the first solution results in a limit to the operating frequency of the part. There will always be a limit to the operating frequency of the part, because there will always be significant delay associated with the clock buffer and distribution circuitry and delays introduced by parasitic resistance and capacitance of the interconnection conductors used to distribute the buffered clock signal to the output buffers, which is evident from FIG. 1. Thus as shown in FIG. 2, after the read command to the memory array circuitry 3 from the address and control input of the memory array, to output data to the output buffers 8, there must be a delay 12 until valid data is output to the data terminals 10, as indicated by the timing diagram DQ. This time is the sum of the internal clock skew from the rising edge of the clock input signal CLK to the rising edge of the delayed clock signal ICLK, and the time from the rising edge of the clock signal ICLK to the time that valid data is output on the output terminals 10 caused by the output buffer delay after it has been clocked by the ICLK signal.

The second solution provides considerable improvement over the first. An on chip oscillator is used in a phase locked loop (PLL) which is synchronized with the input clock signal. The internal clock signal can be either multiplied in frequency or adjusted to remove internal clock skew as much as possible.

A system implementing the second solution is shown in FIG. 3, and a corresponding timing diagram is shown in FIG. 4. A PLL 15 is fed by the input clock signal from receive 5, as well as by a feedback signal on conductor 17 derived from the interconnection conductor which distributes the output buffer enable clock signal. The latter signal is received from the output of the PLL via the internal buffering circuitry represented by buffer 6.

Thus the already buffered (and delayed) clock signal is applied to the PLL and is compared with the input clock signal. Since the operation of the PLL is to synchronize the two signals, the clock signal to be distributed to the enable inputs of the output buffers, represented by the timing diagram ICLK in FIG. 4, is made as close as possible in timing to the input clock signal. The internal clock skew is thus minimized, as illustrated by skew time 19 shown in FIG. 4. Thus the output buffer is enabled much closer to the clock edge that is received by the part and valid data appears sooner relative to the clock edge, and thus allowing higher frequency operation of the part. This is shown by access time 21, which it may be seen is much shorter than access time 12 resulting from the first solution.

However it has been found that the PLL solution also suffers from problems. It is complex, requiring an on-chip oscillator with feedback control of the frequency depending on the monitored status of the on-chip oscillator relative to the input clock. It requires significant stand-by power due to its extra circuitry, and it requires considerable start-up time for the on-chip oscillator to synchronize and lock to the input clock frequency. It also requires use of an analog oscillator in a digital circuit, which requires significantly different and complex fabrication techniques.

SUMMARY OF THE INVENTION

The present invention minimizes the elapsed time between a clock edge that is input to a synchronous memory such as an SDRAM and the time at which the same clock edge eventually triggers the output buffer of the SDRAM to drive valid data onto the output terminals of the SDRAM. The present invention utilizes a delay locked loop (DLL) instead of the phase locked loop used in the second solution described above. The DLL allows higher clock frequency operation while requiring less standby current and start-up time than the system that uses the PLL. No oscillator is required as is required using the PLL, and the entire system can be fabricated using digital integrated circuit technology, rather than a mixture of analog and digital technology.

In accordance with an embodiment of the invention, a clock applying circuit for a synchronous memory is comprised of a clock input for receiving a clock input signal, apparatus connected to the synchronous memory for receiving a driving clock signal, and a tapped delay line for receiving the clock input signal and for delivering the clock driving signal to the synchronous memory in synchronism with but delayed from the clock input signal, the delay being a small fraction of the clock period of the clock input signal. The fraction can be negligibly small.

In accordance with another embodiment, a clock applying circuit is comprised of a synchronous dynamic random access memory (SDRAM) comprised of a memory array and an output buffer connected to the memory array, the memory array having a clock input signal terminal and the output buffer having an enable terminal for receiving a driving clock signal, a clock input for receiving a clock input signal, a tapped delay line comprised of a series of delay elements and having an input, apparatus for applying the clock input signal to the clock input signal terminal and to the input of the tapped delay line, apparatus for receiving output signals of plural ones of the delay elements and for providing one of the output signals of the delay elements as the driving clock signal, apparatus for applying the driving clock signal to the enable terminal of the output buffer, and apparatus for selecting said one of the output signals having a predetermined one of the rising and falling edge time which follows a corresponding rising or falling edge of the clock input signal by a clock skew delay time of the SDRAM between said clock input signal terminal of the memory array and the output buffer.

BRIEF INTRODUCTION TO THE DRAWINGS

A better understanding of the invention will be obtained by reading the description of the invention below, with reference to the following drawings, in which.

DETAILED DESCRIPTION OF THE INVENTION

Figure 1:
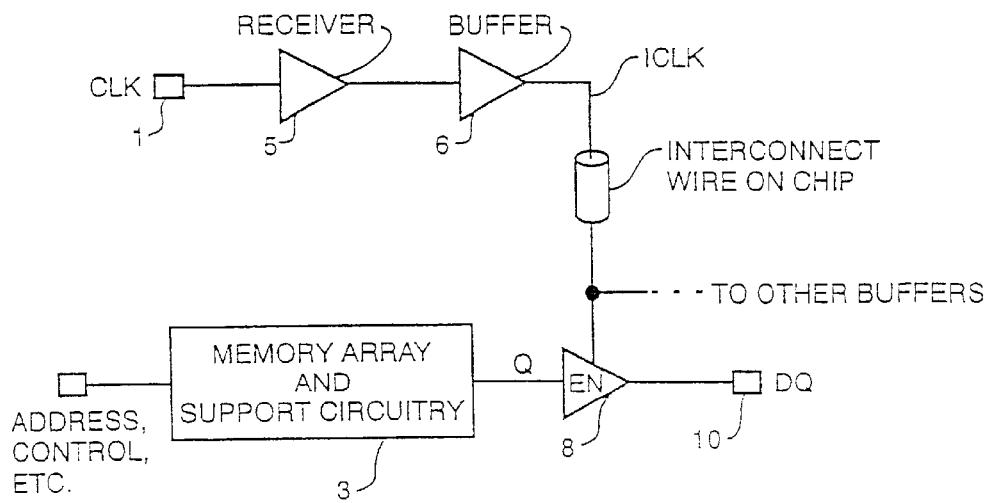
FIGS. 1 and 3 are block diagrams illustrating prior art systems.
Figure 2:
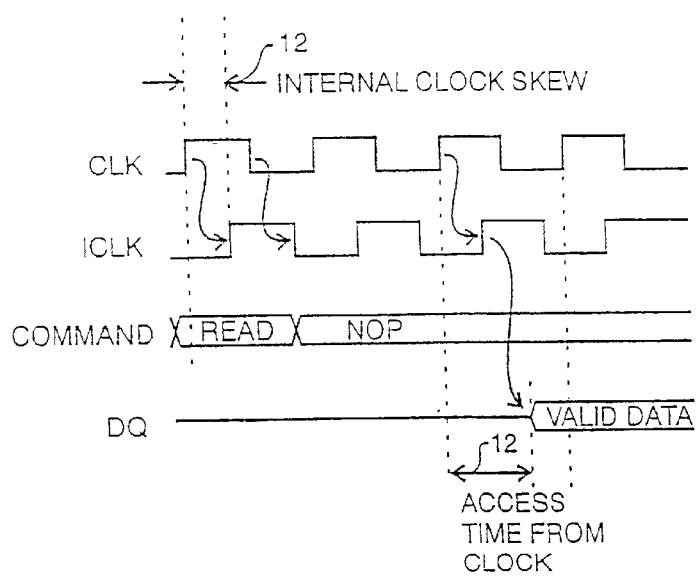
FIGS. 2 and 4 are timing diagrams corresponding to and used in understanding operation of the systems of FIGS. 1 and 3 respectively.
Figure 3:
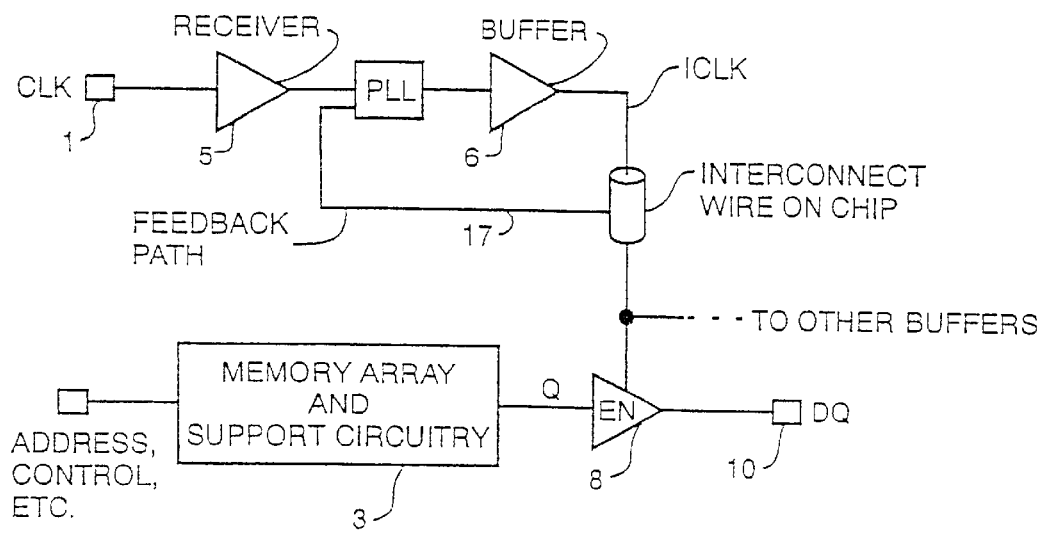
Figure 4:
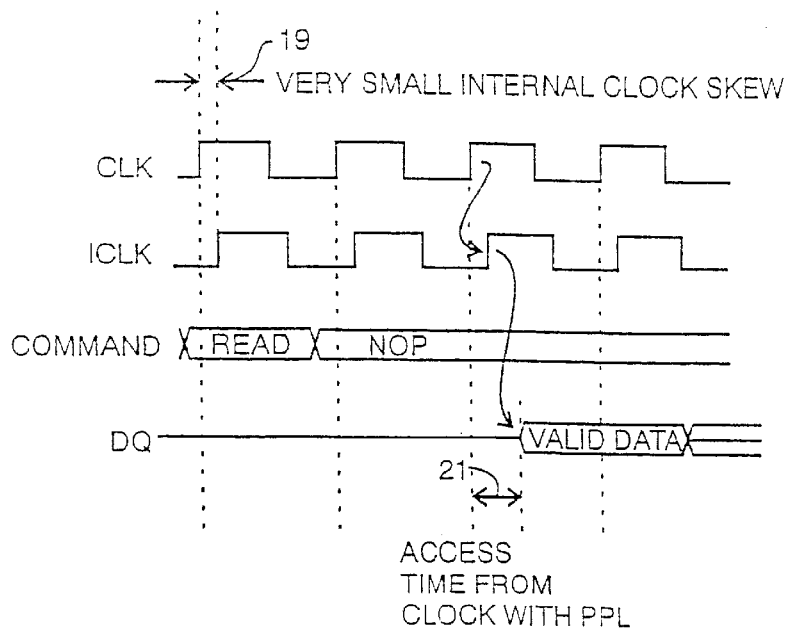
Figure 5:
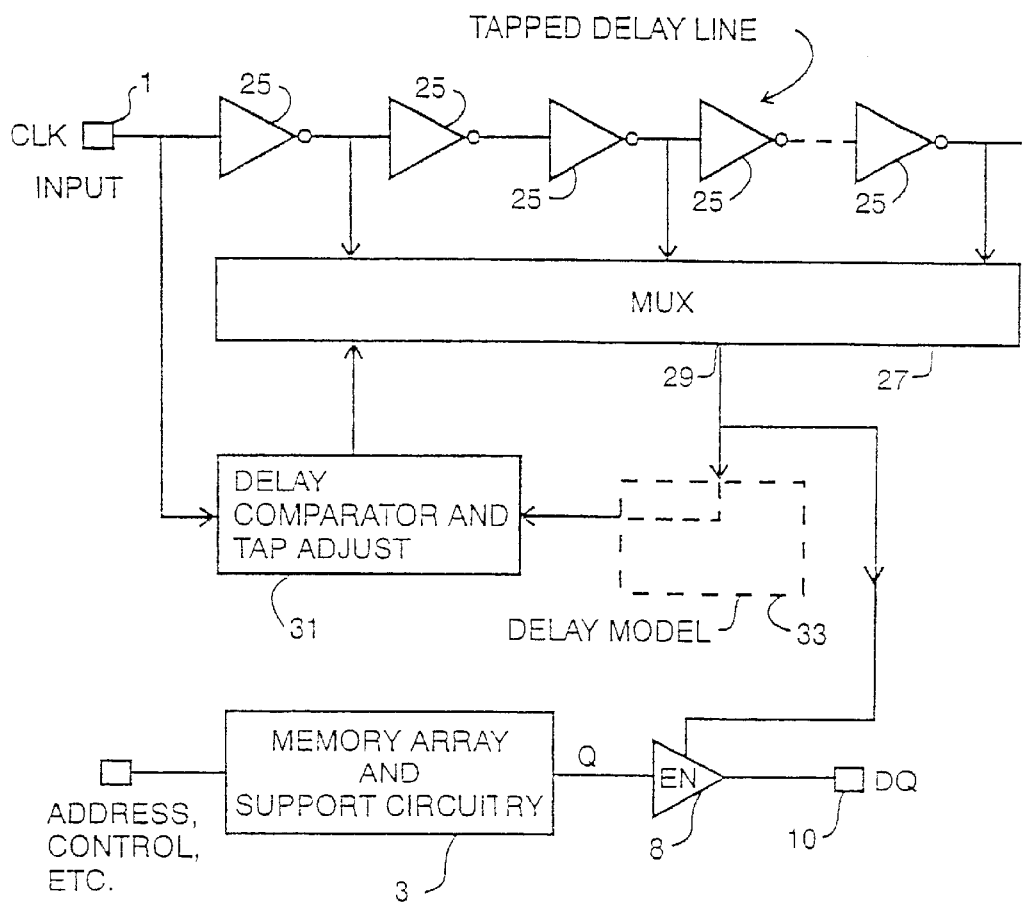
FIG. 5 is a block diagram illustrating an embodiment of the present invention.

Turning to FIG. 5, an input clock signal is applied to a tapped delay line formed of a series of delay elements 25 such as inverters. The outputs of predetermined ones of the delay elements, which can be each one of the delay elements, are provided to the inputs of a selection apparatus such as a multiplexer 27. The output of the multiplexer 29 provides a signal, referred to herein as a driving clock signal, which in this embodiment is applied to the enable terminal of the output buffer in a manner as described above with respect to the prior art systems.

A delay comparator 31 has one input that receives the input clock signal, and another input that receives the driving clock signal. The comparator 31 outputs a control signal which has a value that depends on the differential between the input clock signal and the driving clock signal. That control signal is applied to the control inputs of multiplexer 27, and determines which of the inputs to it are passed through it to output 29 and forms the driving clock signal. The value of the control signal is such that the delay between the input clock signal and the driving clock signal is minimized in the positive sense (i.e. the leading edge of the driving clock signal will always be at the same time or later than the leading edge of the input clock signal).

In this manner the output buffer of the memory will be enabled either no or a minimum time following the input clock.

In another embodiment, the feedback signal (i.e. the driving clock signal) is delayed by a delay circuit 33, referred to herein as a delay model, which use similar elements as the real circuit path taken by the input clock signal, including buffers, logic gates, interconnect conductors, etc. The result is a signal for comparison by the delay comparator 31 which is delayed by a value which tracks the real circuit's performance as operating conditions vary. It's use in a memory can allow the memory to operate at high speeds and maintains its capability as operating conditions such as temperature vary.

While the system requires some time on start-up to adapt itself to a stable operating condition, the start-up modes on most synchronous memories should be sufficient for the output buffer to receive a properly adjusted clock signal. Due to the nature of the delay locked loop, there will be a minimum frequency below which the internal function of the clock will be uncertain. If such frequencies are contemplated, external control circuitry can be used to disable the delay locked loop, such as by using a register bit which when set enables the delay locked loop and when reset disables the delay locked loop. Then the chin operates with the digital locked loop disabled, the start-up time and minimum frequency requirements will be ignored.

If the delay locked loop derived clock is used only for the output buffer, any chip mode registers can be set and data can be written to memory before the delay locked loop has adapted. If the chip enters a power down mode while retaining supply voltage levels, the last tap position can be preserved so that normal operation can be quickly re-enabled.

During a standby state of the memory, the delay locked loop can be disabled, and the delay chain settings can be maintained, as long as the power is applied, allowing the part to enter a low power mode. Upon exit from the standby state into an active state, the system will enter a faster lock since the delay chain settings are maintained.

The delay locked loop can be disabled and the regular buffered version of the system can be used as in the prior art, enabling the output buffer with the prior art form of delayed clock signal, which can allow the system to be tested or operated using a low frequency clock.

The driving clock signal can be used as the clock for the entire memory system, it can be used for only parts of the memory system and the input clock signal used for others, or can be used only to enable the output buffer with the input clock signal used for the remainder of the memory system.

The present invention is not limited for use in conjunction with an SDRAM which was used as an example, but can be used in conjunction with other synchronous memories such as synchronous static random access memories, video random access memories, synchronous graphics random access memories, synchronous read only memories. In addition, other designs of the delay locked loop may be used than the one described herein.

A person understanding this invention may now conceive of alternative structures and embodiments or variations of the above. All of those which fall within the scope of the claims appended hereto are considered to be part of the present invention.

What is claimed is:

1. A synchronous memory comprising:
   a clock input signal;
   an adjustable delay line for generating a data output driving clock signal from the clock input signal; and
   a data output buffer enabled by the driving clock signal for outputting data to an output terminal, the data being output to the output terminal at the same time as or a minimum time following an edge of the clock input signal.

2. Synchronous memory as claimed in claim 1 herein the adjustable delay line is in a delay locked loop.

3. Synchronous memory as claimed in claim 2 wherein the delay locked loop further comprises a delay model circuit which uses similar elements as the circuit path taken by the clock input signal.

4. Synchronous memory as claimed in claim 2 wherein the adjustable delay line is a tapped delay line.

5. Synchronous memory as claimed in claim 4 wherein taps provide plural outputs of the delay line.

6. Synchronous memory as claimed in claim 1 wherein the adjustable delay line is adapted to be disabled as a clock source to the data output buffer.

7. Synchronous memory as claimed in claim 1 wherein the adjustable delay line is used only to enable the data output buffer.

8. A synchronous dynamic random access memory comprising:
   a clock input signal;
   a delay locked loop comprising an adjustable delay line for generating a data output driving clock signal from the clock input signal; and
   a data output buffer enabled by the driving clock signal for outputting data to an output terminal, the data being output to the output terminal at the same time as or a minimum time following an edge of the clock input signal.

9. A method of enabling synchronous memory data output comprising:
   delaying a clock input signal in an adjustable delay line to generate a data output driving clock signal; and
   enabling output data with the driving clock signal, the data being output to an output terminal at the same time as or a minimum time following an edge of the clock input signal.

10. A method of enabling synchronous memory data output as claimed in claim 9 wherein the adjustable delay line is in a delay locked loop.

11. A method of enabling synchronous memory data output as claimed in claim 10 wherein the delay locked loop further comprises a delay model circuit which uses similar elements as the circuit path taken by the clock input signal.

12. A method of enabling synchronous memory data output as claimed in claim 10 wherein the adjustable delay line is a tapped delay line.

13. A method of enabling synchronous memory data output as claimed in claim 12 wherein taps provide plural outputs of the delay line.

14. A method of enabling synchronous memory data output as claimed in claim 9 further comprising disabling the adjustable delay line as a clock source for enabling output data.

15. A method of enabling synchronous memory data output as claimed in claim 9 wherein the adjustable delay line is used only to enable output data.

16. A method of enabling synchronous random access memory data output comprising:
   delaying a clock input signal in an adjustable delay line of a delay locked loop to generate a data output driving clock signal; and
   enabling output data with the driving clock signal, the data being output to an output terminal at the same time as or a minimum time following an edge of the clock input signal.

17. A synchronous dynamic random access memory comprising:
   means for delaying a clock input signal in an adjustable delay line of a delay locked loop to generate a data output driving clock signal; and
   means for enabling output data with the driving clock signal, the data being output to an output terminal at the same time as or a minimum time following an edge of the clock input signal.

* * * * *